(12) United States Patent
Olgaard

(10) Patent No.: US 6,307,429 B1
(45) Date of Patent: Oct. 23, 2001

(54) EXTENDED POWER RAMP TABLE FOR POWER AMPLIFIER CONTROL LOOP

(75) Inventor: Christian Olgaard, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/481,334

(22) Filed: Jan. 12, 2000

(51) Int. Cl.[7] .................................................. G01R 19/00
(52) U.S. Cl. ................................................. 330/2; 330/129
(58) Field of Search ................................ 330/2, 129, 279

(56) References Cited

U.S. PATENT DOCUMENTS

| | | | |
|---|---|---|---|
| 4,523,155 | 6/1985 | Walczak et al. | 330/279 |
| 4,602,218 | 7/1986 | Vilmur et al. | 330/279 |
| 5,150,075 | 9/1992 | Hietala et al. | 330/279 |
| 5,194,822 | * 3/1993 | Bureau et al. | 330/129 |
| 5,278,519 | 1/1994 | Williams | 330/306 |
| 5,406,227 | 4/1995 | Williams | 330/306 |
| 5,416,441 | * 5/1995 | Nagano | 330/129 |
| 5,546,050 | 8/1996 | Florian et al. | 330/282 |
| 5,642,075 | * 6/1997 | Bell | 330/129 |
| 5,656,972 | * 8/1997 | Norimatsu | 330/129 |
| 5,748,037 | 5/1998 | Rozental et al. | 330/2 |
| 5,768,695 | 6/1998 | Fischer et al. | 455/127 |
| 5,796,309 | 8/1998 | Nguyen | 330/289 |
| 5,929,704 | * 7/1999 | Proctor, Jr. et al. | 330/149 |

OTHER PUBLICATIONS

Philips Semiconductors, "Data Sheet, PCF5075, Power Amplifier Controller for GSM and PCN Systems", Feb. 27, 1997, pp. 1–27.

* cited by examiner

Primary Examiner—Benny Lee
Assistant Examiner—Henry Choe
(74) Attorney, Agent, or Firm—Mark A. Dalla Valle; Wildman, Harrold, Allen & Dixon

(57) ABSTRACT

An extended power ramp table for a power amplifier control loop in a time division multiple access (TDMA) communication system includes a power profile data table and a control data table. The power profile data are used to control transitions of the power amplifier circuit between its on and off states to minimize the number and power levels of spurious and other undesired signals generated by such on and off circuit state transitions. The control data are used to programmably control various performance characteristics of the control loop for the power amplifier circuit, such as controlling the gain of the driver amplifier for the power amplifier control (or reference) signal, controlling the gain and offset of the feedback amplifier for the control loop, and selectively providing a bias current for an external power detection diode. By making the control data user programmable, maximum flexibility in controlling the power amplifier control loop can be achieved.

9 Claims, 4 Drawing Sheets

US 6,307,429 B1

EXTENDED POWER RAMP TABLE FOR POWER AMPLIFIER CONTROL LOOP

BACKGROUND OF THE INVENTION

1. Field of the Invention

The present invention relates to power amplifier control circuits, and in particular, to power ramp up and ramp down control circuits for power amplifiers.

2. Description of the Related Art

Power amplifiers for amplifying radio frequency (RF) signals for wireless transmission are used in many applications. One increasingly common application is that of a radio telephone communication system, such as a cellular telephone system. One example of such a system is a time division multiple access (TDMA) communication system, such as that based upon the Global System for Mobile Communication (GSM) standard. In such a system, relatively narrow single channels within the prescribed RF spectrum are shared by multiple telephones, with each one being allocated a specific time slot on a repetitive basis. During its assigned time slot, the transceiver must set its outgoing signal to the appropriate frequency and ramp up the power level of such signal by ramping up the power amplification of the power amplifier to the appropriate level. Once the data has been transmitted, the power amplification of the power amplifier must then be ramped down prior to the beginning of the next time slot so as to not cause interference with the user assigned to that time slot.

This ramping up and down of the power amplification provided by the power amplifier defines a power profile which must be maintained in accordance with strict specifications. If such power ramping is not accurately controlled then spurious and other undesired signals may be generated in adjacent time slots or at improper frequencies, thereby causing interference with other users within the system, as well as possibly causing interference with other users of other systems elsewhere within the RF spectrum.

The conventional technique to maintain this control over the power amplifier uses a feedback loop with a reference power ramp curve that is generated in accordance with a programmable power profile data table which drives a digital-to-analog converter (DAC). Generally the ramp generator circuit is implemented in an integrated circuit (IC) and the power control loop itself is implemented using components external to such IC. (Examples of this approach can be found in the disclosures of U.S. Pat. Nos. 5,150,075 and 5,748,037, the disclosures of which are incorporated herein by reference.) Typically some form of processor, such as a microprocessor or digital signal processor, is used to generate the ramp and exercise control over the feedback loop for the power ramp control circuit.

While such systems perform reasonably well, they nonetheless suffer from a number of disadvantages. For example, due to the use of external components for the power control loop itself, it is difficult, if not impossible, to control the dynamic range of the loop. Plus, the use of external components is generally significantly more expensive than if the power control loop were more fully integrated with the ramp generator circuit. Furthermore, any control over the power control loop itself would require additional control tasks to be performed by the microprocessor or DSP. Accordingly, it would be desirable to have a power amplifier control loop which can be subjected to greater levels of control without requiring additional processor resources.

SUMMARY OF THE INVENTION

An extended power ramp table for a power amplifier control loop in a TDMA communication system in accordance with the present invention provides for the storage and use of additional programmable control data for use in conjunction with the power ramp profile data provided by the power ramp table. These additional control data can be used to control the dynamic range of the power amplifier control loop during the turn-on and turn-off sequences with accurate timing and without requiring additional processor resources. For example, a control signal could be provided which forces the power amplifier to its final power value by changing the control loop to a feed forward configuration when transmitting at the maximum power level, thereby increasing the efficiency of the power amplifier. Another control signal can be used to increase the loop gain when small feedback signals from the power amplifier are being received or during the initial portion of the ramp up interval for closing the loop more quickly prior to the power ramp achieving its final value. Many other types of control can be exercised as desired by making these additional control signals programmable by the user.

In accordance with one embodiment of the present invention, an extended power ramp table for a power amplifier control loop in a time division multiple access (TDMA) communication system includes a power profile data table and a control data table. The power profile data table is configured to store power profile data and receive a clock signal and in accordance therewith read out the power profile data as a sequential series of discrete power data sets corresponding to discrete time segments of a defined power profile including turn-on and turn-off power profiles of a signal power amplifier. The control data table is configured to store control data and receive the clock signal and in accordance therewith read out the control data as a sequential series of discrete control data sets, wherein respective ones of the sequential series of discrete control data sets correspond to respective ones of the sequential series of discrete power data sets.

In accordance with another embodiment of the present invention, a power ramp control circuit for a power amplifier control loop in a time division multiple access (TDMA) communication system includes a data storage circuit, a digital-to-analog conversion circuit and a control signal amplifier circuit. The data storage circuit is configured to store data and receive a clock signal and in accordance therewith read out the data as: a sequential series of discrete power data sets corresponding to discrete time segments of a defined power profile including turn-on and turn-off power profiles of a signal power amplifier; and a sequential series of discrete control data sets; wherein respective ones of the sequential series of discrete control data sets correspond to respective ones of the sequential series of discrete power data sets. The digital-to-analog conversion circuit, coupled to the data storage circuit, is configured to receive the sequential series of discrete power data sets and in accordance therewith provide an analog signal with a sequential series of corresponding analog signal values. The control signal amplifier circuit, coupled to the digital-to-analog conversion circuit and the data storage circuit, is configured to receive the analog signal and the sequential series of discrete control data sets and to couple to the signal power amplifier and receive a detected power signal corresponding to a power level of an output signal from the signal power amplifier and in accordance therewith provide a power level control signal for the signal power amplifier.

These and other features and advantages of the present invention will be understood upon consideration of the following detailed description of the invention and the accompanying drawings.

DETAILED DESCRIPTION OF THE INVENTION

Figure 1:
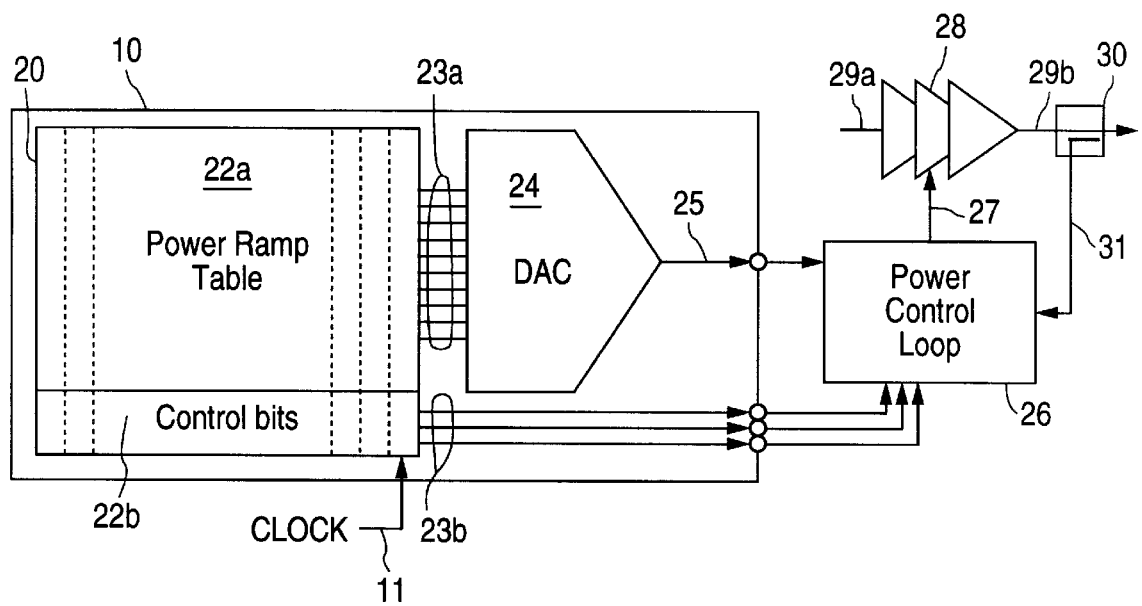
FIG. 1 is a functional block diagram of a power control loop using an extended power ramp table in accordance with one embodiment of the present invention.

Referring to FIG. 1, a power ramp generating circuit 10 in accordance with one embodiment of the present invention includes a data table 20 and a DAC 24. The data table 20 includes a power ramp table 22a, for storing the power ramp data, and a control bits table 22b, for storing the one or more additional control bits to be used for controlling the power control loop 26. Power ramp data 23a and control bits 23b are synchronously read from the data table 20 in accordance with a clock signal 11. The power ramp data 23a are presented to the DAC 24 for conversion to an analog signal 25 which is used as the control, or reference, signal for the power control loop 26.

Figure 1A:
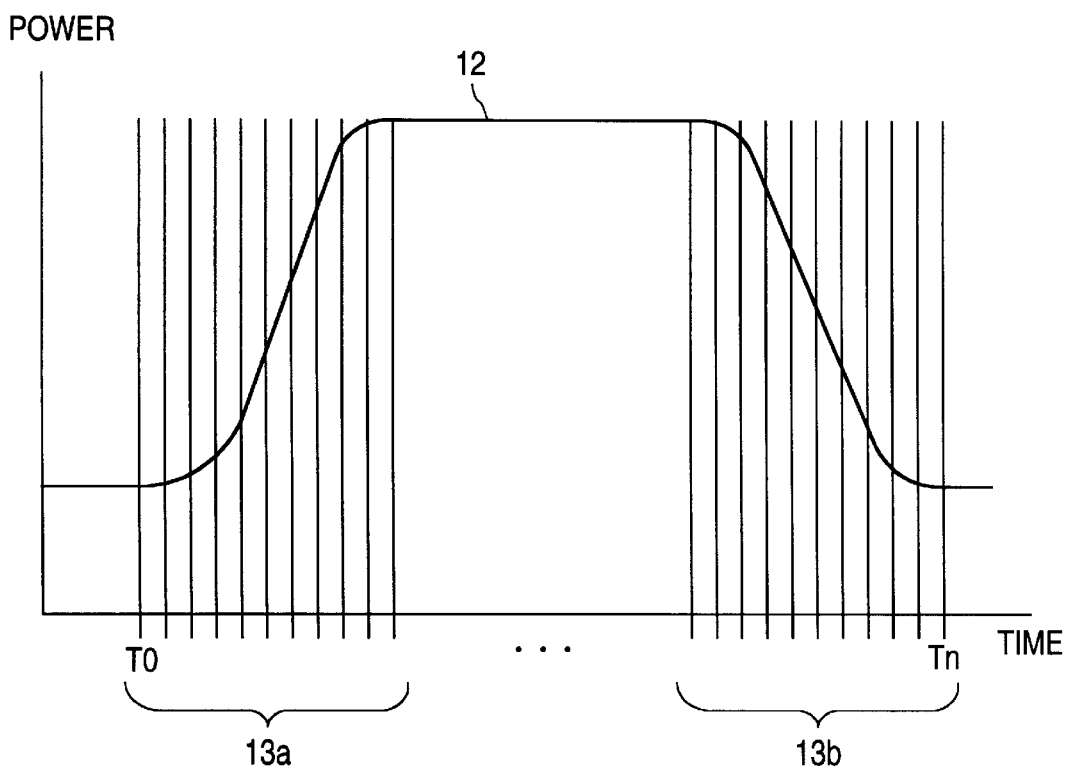
FIG. 1A illustrates conceptually the ramping up and ramping down of the power amplification characteristic of the power amplifier.

In accordance with the one or more control bits 23b, the power control loop 26 uses the analog signal 25 to generate the actual control signal 27 for the power amplifier 28 which amplifies an input signal 29a to produce an amplified output signal 29b in accordance with the power ramp profile defined by the power ramp data stored in power ramp table 22a, as represented by the graph of FIG. 1A. A power coupler 30 can be used to sample the output power of this amplified signal 29b to produce a feedback signal 31 for the power control loop 26. Using this feedback signal 31, the power control loop 26, in accordance with the additional control bits 23b, generates the desired control signal 27 in accordance with the desired power ramp profile and power control loop characteristics for ramping up, maintaining, and ramping down the power amplification characteristic of the power amplifier 28.

Referring to FIG. 1A, it will be appreciated that by extending the data table 20 to include one or more additional control bits 22b to be read out synchronously with the power ramp data 22a selected characteristics of the power control loop 26 can be controlled individually during each time segment 13a, 13b of the ramping up and ramping down power characteristics of the power profile 12 for the power amplifier 28 as defined by the power ramp data 23a.

Figure 2:
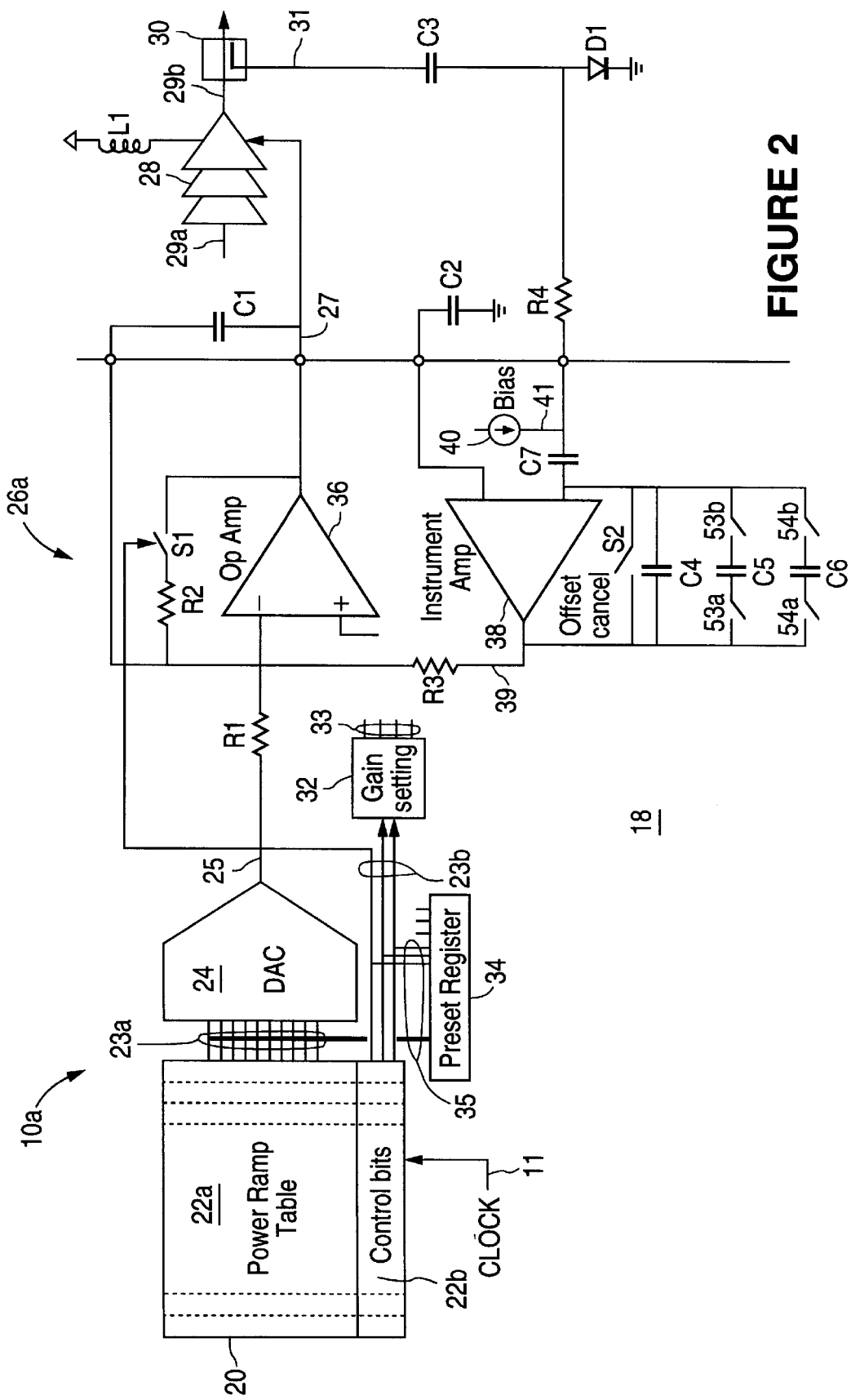
FIG. 2 is a schematic diagram of one implementation of an integrated form of the power amplifier control loop of FIG. 1.

Referring to FIG. 2, implementations of the power ramp generating circuit 10a and power control loop circuitry 26a can be integrated within one IC 18. As before, the data table 20 provides data storage areas 22a, 22b from which the power ramp data 23a and one or more control bits 23b are read out in accordance with a clock signal 11. The DAC 24 converts the digital power ramp data 23a to the analog signal 25, while the control bits 23b are used to control the power loop control circuitry 26a. (The various portions 22a, 22b of the data table 20 can be implemented using memory, such as random access memory, or shift registers.) A preset register 34 can be used to provide initial, or preset, values for the power ramp data 23a and control bits 23b. Multiple control bits 23b can be decoded by a gain setting stage 32 to produce multiple gain control signals 33 (discussed further below).

The analog signal 25 is summed with a feedback signal 39 (discussed further below) and processed by an operational amplifier circuit 36 which functions as either an integrator, due to the feedback connection of capacitor C1, or as a feed forward amplifier circuit when switch S1 is closed in accordance with one of the control bits 23b. (This may be done, for example, during that portion of the turn on, or ramp up, portion of the power profile when increased loop gain is desired.) As discussed above, the resulting signal 27 forms the control signal for the power amplifier circuitry 28.

In the feedback portion of the control loop, an instrumentation amplifier 38 is used to process the feedback signal 31 obtained by sampling the output signal 29b with a power coupler 30. This feedback signal 31, decoupled by capacitor C3, is detected with a power detector diode D1 which is selectively biased by a bias current 41 provided by a current source 40 within the IC 18. The detected power signal is processed by the instrumentation amplifier 38 in accordance with a programmable gain which is determined in accordance with the open and closed states of switches S3a, S3b, S4a, S4b, with offset cancellation provided by switch S2. The switches S2, S3a, S3b, S4a, S4b (e.g., implemented in the form of pass transistors or transmission gates) are controlled by the decoded gain control signals 33. The resulting feedback signal 39, as noted above, is summed with the analog power ramp signal 25.

Figure 3:
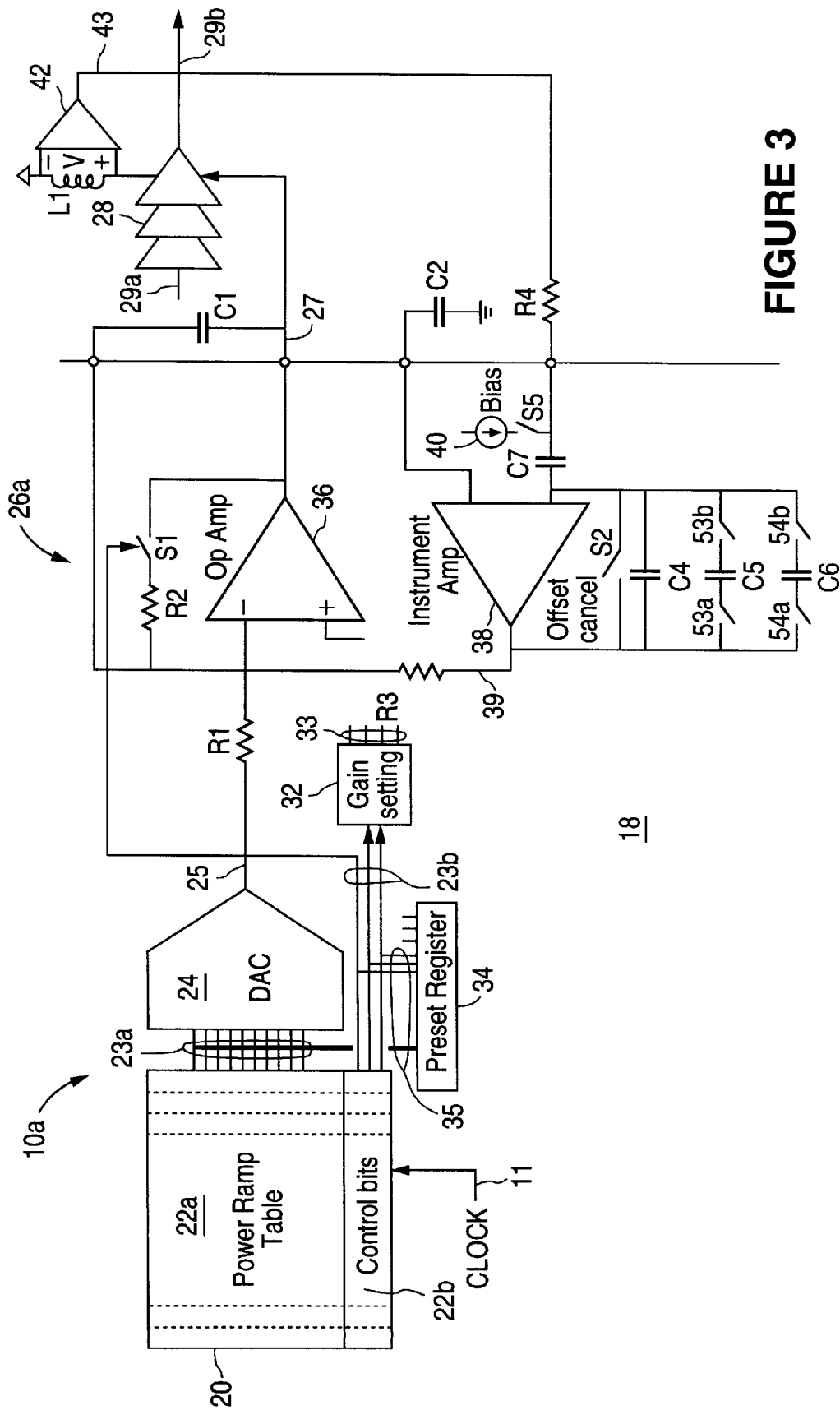
FIG. 3 is a schematic diagram of another implementation of a power control loop using the integrated circuit of FIG. 2.

Referring to FIG. 3, the power control loop circuitry 26a can be configured, e.g., in accordance with the decoded control signals 33, to operate with a different form of feedback signal 43. Instead of using a detected power signal, a voltage V detected across a series inductor L1 in the supply current path for the power amplifier 28 can be amplified with an amplifier 42 to produce a feedback signal 43 for processing by the instrumentation amplifier 38. In this implementation, switch S5 is open, thereby effectively removing the bias current source 40 from the feedback loop.

Figure 4:
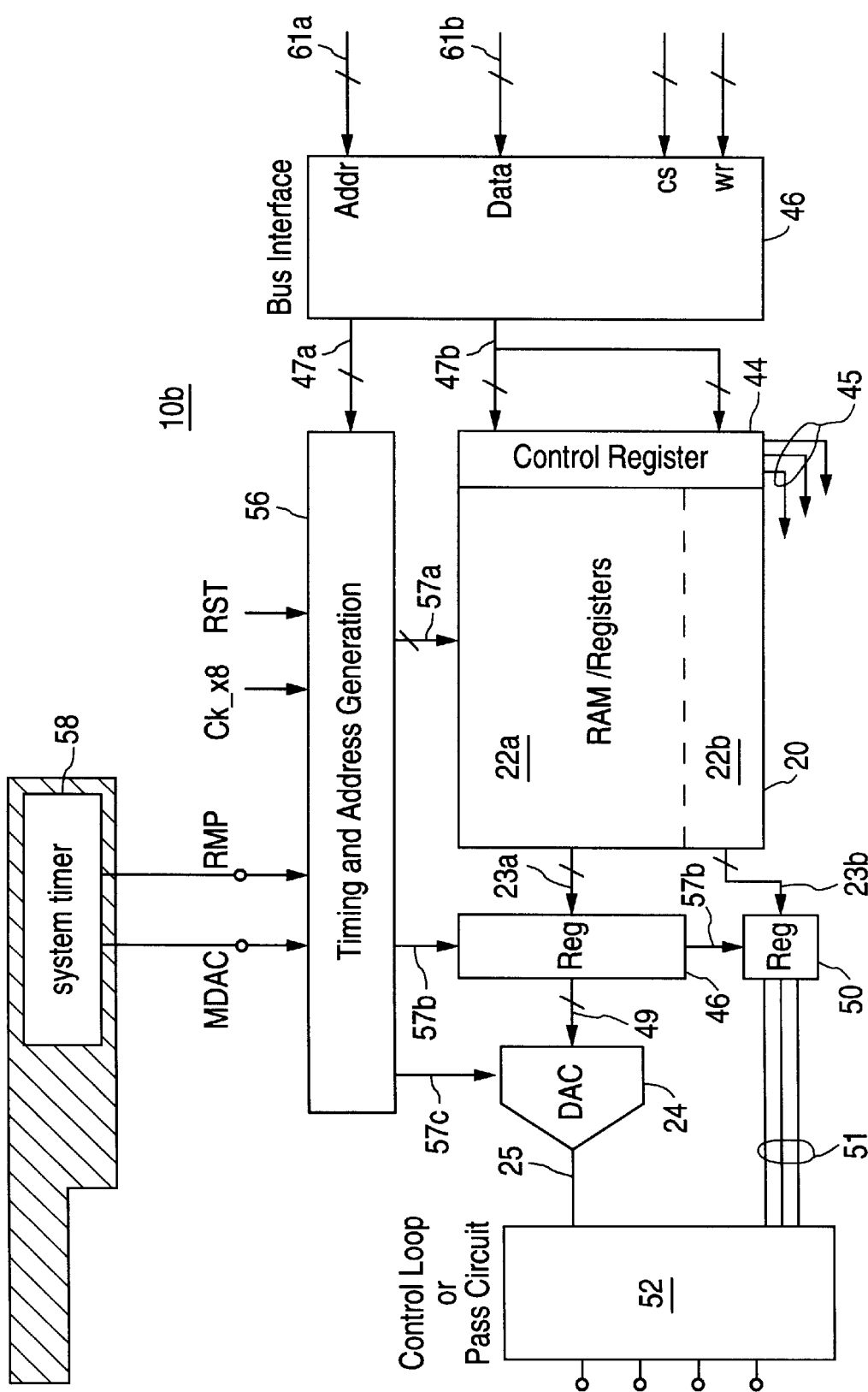
FIG. 4. is a functional block diagram of a power ramp generating circuit using an extended power ramp table in accordance with another embodiment of the present invention.

Referring to FIG. 4, an alternative implementation 10b of the power ramp generating circuit includes the data table 20 and DAC 24, plus a number of additional components: a bus interface 46; a set 44 of control registers; a timing and address generating circuit 56; a system timer 58; and registers 48, 50. In this implementation, the power profile data and control bits are received as data 61b via the bus interface 46. These data 47b are stored in memory (or registers) 22a, 22b via the control registers 44. Addressing and timing data 47a are provided to the timing and address generating circuit 56 which, in accordance with system timing information from the system timer 58 and a clock and reset signal, provide appropriate addressing data 57a and timing signals 57b, 57c for the data table 20, output registers 48, 50 and DAC 24. The final analog output signal 25 and control bits 51 are provided to the next stage 52 which may be the actual control loop circuitry 26 (FIGS. 1, 2 and 3) or some form of pass, or buffer, circuit which precedes the actual control loop circuitry.

As will be readily appreciated, the power profile data and control bits can be programmed into the data table 20 and may be in the form of either user-defined data based upon various predetermined circuit performance criteria, or alternatively, in the form of dynamic real time data. For example, dynamic real time data in the form of measured temperature information can be introduced via the data bus 61b to provide new power profile data or control bits directly or to provide data for modifying with the existing power profile data or control bits already stored within the data table 20. Such measured temperature information may be the ambient temperature for the system or the temperature sensed at a location physically near the final output stage of the power amplifier 28. Other dynamic real time information may be based upon the frequency of the output signal so as to provide frequency compensation for the power ramp profile or power control loop performance characteristics.

From the foregoing discussion, it should be appreciated that an extended power ramp table implementation in accordance with the present invention advantageously provides for a more easily integrated system. Such a system avoids the need for the additional circuit terminals or package pins that would be necessary if the microprocessor was responsible for this additional power ramp control. Such additional terminals and/or pins would be needed since the analog circuitry is generally implemented separately from the digital circuitry.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an extended power ramp table for a power amplifier control loop in a time division multiple access (TDMA) communication system, comprising:
    a power profile data table that stores a plurality of power profile data, receives a clock signal and reads out said plurality of power profile data as a sequential series of discrete power data sets corresponding to discrete time segments of a defined power profile including turn-on and turn-off power profiles of a signal power amplifier; and
    a control data table that stores a plurality of control data, receives said clock signal and reads out said plurality of control data as a sequential series of discrete control data sets, wherein respective ones of said sequential series of discrete control data sets correspond to respective ones of said sequential series of discrete power data sets;
    wherein said power profile and control data tables comprise a plurality of shift registers.

2. An apparatus including an extended power ramp table for a power amplifier control loop in a time division multiple access (TDMA) communication system, comprising:
    a power profile data table that stores a plurality of power profile data, receives a clock signal and reads out said plurality of power profile data as a sequential series of discrete power data sets corresponding to discrete time segments of a defined power profile including turn-on and turn-off power profiles of a signal power amplifier;
    a control data table that stores a plurality of control data, receives said clock signal and reads out said plurality of control data as a sequential series of discrete control data sets, wherein respective ones of said sequential series of discrete control data sets correspond to respective ones of said sequential series of discrete power data sets; and
    a control signal amplifier circuit, coupled to said power profile data table and said control data table, that receives said sequential series of discrete power data sets and said sequential series of discrete control data sets, couples to said signal power amplifier, receives a detected power signal corresponding to a power level of an output signal from said signal power amplifier, and provides a power level control signal for said signal power amplifier.

3. An apparatus including an extended power ramp table for a power amplifier control loop in a time division multiple access (TDMA) communication system, comprising:
    a power profile data table that stores a plurality of power profile data, receives a clock signal and reads out said plurality of power profile data as a sequential series of discrete power data sets corresponding to discrete time segments of a defined power profile including turn-on and turn-off power profiles of a signal power amplifier;
    a control data table that stores a plurality of control data, receives said clock signal and reads out said plurality of control data as a sequential series of discrete control data sets, wherein respective ones of said sequential series of discrete control data sets correspond to respective ones of said sequential series of discrete power data sets; and
    a dynamic power profile data source, coupled to said power profile data table, that provides a plurality of dynamic data as said plurality of power profile data;
    wherein said plurality of dynamic data comprises a plurality of compensated data representing said plurality of power profile data compensated for a measured temperature associated with said signal power amplifier.

4. An apparatus including an extended power ramp table for a power amplifier control loop in a time division multiple access (TDMA) communication system, comprising:
    a power profile data table that stores a plurality of power profile data, receives a clock signal and reads out said plurality of power profile data as a sequential series of discrete power data sets corresponding to discrete time segments of a defined power profile including turn-on and turn-off power profiles of a signal power amplifier;
    a control data table that stores a plurality of control data, receives said clock signal and reads out said plurality of control data as a sequential series of discrete control data sets, wherein respective ones of said sequential series of discrete control data sets correspond to respective ones of said sequential series of discrete power data sets; and
    a dynamic power profile data source, coupled to said power profile data table, that provides a plurality of dynamic data as said plurality of power profile data;
    wherein said plurality of dynamic data comprises a plurality of compensated data representing said plurality of power profile data compensated for a frequency of a signal amplified by said signal power amplifier.

5. An apparatus including a power ramp control circuit for a power amplifier control loop in a time division multiple access (TDMA) communication system comprising:
    a data storage circuit that stores a plurality of power and control data, receives a clock signal and reads out said plurality of data as
        a sequential series of discrete power data sets corresponding to discrete time segments of a defined power profile including turn-on and turn-off power profiles of a signal power amplifier, and a sequential series of discrete control data sets, wherein respective ones of said sequential series of discrete control data sets correspond to respective ones of said sequential series of discrete power data sets;

a digital-to-analog conversion circuit, coupled to said data storage circuit, that receives said sequential series of discrete power data sets and provides an analog signal with a sequential series of corresponding analog signal values; and a control signal amplifier circuit, coupled to said digital-to-analog conversion circuit and said data storage circuit, that receives said analog signal and said sequential series of discrete control data sets, couples to said signal power amplifier, receives a detected power signal corresponding to a power level of an output signal from said signal power amplifier, and provides a power level control signal for said signal power amplifier.

6. The apparatus of claim 5, further comprising a dynamic power profile data source, coupled to said data storage circuit, that provides a plurality of dynamic data as at least a portion of said plurality of power and control data.

7. The apparatus of claim 5, further comprising a control data source, coupled to said data storage circuit, that provides a plurality of user defined data as at least a portion of said plurality of power and control data.

8. An apparatus including an extended power ramp table for a power amplifier control loop in a time division multiple access (TDMA) communication system, comprising:

power profile data means for storing a plurality of power profile data, receiving a clock signal and reading out said plurality of power profile data as a sequential series of discrete power data sets corresponding to discrete time segments of a defined power profile including turn-on and turn-off power profiles of a signal power amplifier;

control data table means for storing a plurality of control data, receiving said clock signal and reading out said plurality of control data as a sequential series of discrete control data sets, wherein respective ones of said sequential series of discrete control data sets correspond to respective ones of said sequential series of discrete power data sets; and control signal amplifier means for receiving said sequential series of discrete power data sets and said sequential series of discrete control data sets, coupling to said signal power amplifier, receiving a detected power signal corresponding to a power level of an outpost signal from said signal power amplifier, and providing a power level control signal for said signal power amplifier.

9. An apparatus including power ramp control circuit for a power amplifier control loop in a time division multiple access (TDMA) communication system, comprising:

data storage means for storing a plurality of data, receiving a clock signal and reading out said plurality of data as a sequential series of discrete power data sets corresponding to discrete time segments of a defined power profile including turn-on and turn-off power profiles of a signal power amplifier, and a sequential series of discrete control data sets, wherein respective ones of said sequential series of discrete control data sets correspond to respective ones of said sequential series of discrete power data sets;

digital-to-analog convertor means for receiving said sequential series of discrete power data sets and providing an analog signal with a sequential series of corresponding analog signal values; and control signal amplifier means for receiving said analog signal and said sequential series of discrete control data sets, coupling to said signal power amplifier, receiving a detected power signal corresponding to a power level of an output signal from said signal power amplifier, and providing a power level control signal for said signal power amplifier.

* * * * *